United States Patent
Chen

(10) Patent No.: US 7,257,752 B2
(45) Date of Patent: Aug. 14, 2007

(54) CIRCUIT AND METHOD FOR PERFORMING BUILT-IN SELF TEST AND COMPUTER READABLE RECORDING MEDIUM FOR STORING PROGRAM THEREOF

(75) Inventor: Chung-Hui Chen, Hsinchu County (TW)

(73) Assignee: Faraday Technology Corp., Hsin-Chu (TW)

( * ) Notice: Subject to any disclaimer, the term of this patent is extended or adjusted under 35 U.S.C. 154(b) by 202 days.

(21) Appl. No.: 11/160,102

(22) Filed: Jun. 9, 2005

(65) Prior Publication Data

US 2007/0011538 A1    Jan. 11, 2007

(51) Int. Cl.
*G01R 31/28* (2006.01)
(52) U.S. Cl. .................... 714/733; 714/718
(58) Field of Classification Search .......... 714/726, 714/724, 719, 733, 718; 716/7; 324/765; 365/201
See application file for complete search history.

(56) References Cited

U.S. PATENT DOCUMENTS

| | | | | |
|---|---|---|---|---|
| 4,703,484 A | * | 10/1987 | Rolfe et al. | 714/726 |
| 5,854,752 A | * | 12/1998 | Agarwal | 716/7 |
| 6,148,425 A | * | 11/2000 | Bhawmik et al. | 714/726 |
| 6,289,477 B1 | * | 9/2001 | Gunadisastra | 714/724 |
| 6,541,994 B2 | * | 4/2003 | Masuda | 324/765 |
| 6,907,555 B1 | * | 6/2005 | Nomura et al. | 714/719 |
| 6,934,205 B1 | * | 8/2005 | Pandey et al. | 365/201 |

* cited by examiner

Primary Examiner—David Ton
(74) Attorney, Agent, or Firm—Winston Hsu

(57) ABSTRACT

A circuit and a method for built-in self test (BIST) and a computer readable recording medium for storing program thereof are provided. The BIST circuit serves a system to self test a circuit-under-test in the system. The system further includes a unit circuit having a plurality of input terminal couple to a plurality of signal path respectively, and an output terminal couple to the circuit-under-test. A selection and activation circuit of the BIST circuit having an output terminal couple to one of input terminals of the unit circuit, one input terminal couple to a non-timing-critical path of the signal paths, and the other input terminal receives a test signal. When the system operates in a test mode, the BIST controller provides the test signal through the selection and activation circuit and the unit circuit to test the circuit-under-test.

18 Claims, 2 Drawing Sheets

CIRCUIT AND METHOD FOR PERFORMING BUILT-IN SELF TEST AND COMPUTER READABLE RECORDING MEDIUM FOR STORING PROGRAM THEREOF

BACKGROUND OF THE INVENTION

1. Field of the Invention

The present invention relates to a circuit testing method. More particularly, the present invention relates to a built-in self-test (BIST) circuit and a testing method thereof.

2. Description of the Related Art

To guarantee the correct operation of a system (for example, an integrated circuit), various methods and tools are set up to test the circuits within the system. Built-in self-test (BIST) is particularly suitable for testing the important circuits (for example, the memory) in a system.

A built-in self-test (BIST) circuit serves the system to self test a specific test circuit in the system (normally for testing the memory of an integrated circuit, called circuit-under-test hereafter). FIG. 1 is a block diagram showing a conventional integrated circuit having a built-in self-test circuit therein. In FIG. 1, the memory 110 represents the circuit-under-test and the address terminal ADDR and the chip select terminal CS represent the plurality of input terminals of the memory 110. Furthermore, the unit circuit (for example, the multiplexer 121 and the OR gate 122) coupled to the memory 110 represents the logic circuit 120 of the system.

Under normal operation, the logic circuit 120 of the integrated circuit will include a plurality of data-signal paths (e.g. address path and data path, address path A, B and C are used as examples) and control-signal lines (e.g. write-enable line and chip-select line, the chip-select line CS1 and CS2 are used as examples) for accessing the memory 110. To facilitate explanation, only the input terminal ADDR of the address bus and the input terminal CS of chip select are used as examples. The multiplexer 121 is used for switching one of the data-signal paths (A, B or C) to the address terminal ADDR of the memory 110. Furthermore, an OR gate 122 connects with different chip-select lines CS1 and CS2 to output one of the input signals to the chip select terminal CS of the memory 110.

In general, an extra multiplexer 132 or an OR gate 133 must be inserted between the logic circuit 120 and the input terminals (for example, the address bus terminal, the data input bus terminal, the chip select terminal and the write enable terminal) of the memory 110 when adding any memory built-in self-test (BIST) circuit 130. When the system operates in a test mode, the BIST controller 131 controls the multiplexer 132 to switch address signal source of the memory 110 from the address signal 123 outputted from the logic circuit 120 to the address signal BISTA outputted from the BIST controller 131. At this moment, the BIST controller 131 generates and outputs a plurality of test data to the memory 110 and then read the output data from the memory 110 to test if the memory 110 operates correctly.

However, in many design, the address bus, chip select lines and write enable lines are timing-critical paths. Hence, the conventional method of adding a BIST circuit for testing the memory often leads to a drop of the clock speed. Therefore, this type of design is unsuitable for a high-speed circuit.

SUMMARY OF THE INVENTION

Accordingly, at least one objective of the present invention is to provide a built-in self-test (BIST) circuit that can minimize the degradation on clock speed due to the presence of the BIST circuit.

At least a second objective of the present invention is to provide a method for performing a built-in self-test that can minimize the degradation of clock speed due to the presence of a BIST circuit.

At least a third objective of the present invention is to provide a computer readable recording medium that can store a program that can be executed by a computer system such that the program can add a BIST circuit to a system circuit read-out without degradating the clock speed.

To achieve these and other advantages and in accordance with the purpose of the invention, as embodied and broadly described herein, the invention provides a built-in self-test (BIST) circuit for serving to self-test a circuit-under-test in a system. The system further comprises a unit circuit having a plurality of input terminals coupled to a plurality of signal paths, respectively. An output terminal of the unit circuit is coupled to the circuit-under-test to provide signals for providing the circuit-under-test with necessary signals. The BIST circuit comprises a BIST controller and a selection and activation circuit. When the system operates in a test mode, the BIST controller generates a test signal to test the circuit-under-test. The output terminal of the selection and activation circuit is coupled to one of the input terminals of the unit circuit. One of the input terminals of the selection and activation circuit is coupled to the corresponding non-timing-critical path of the signal paths. Another input terminal of the selection and activation circuit receives the test signal. When the system operates in the test mode, the test signals output to the output terminal of the selection and activation circuit so that the test signals can pass through the unit circuit to test the circuit-under-test.

According to the BIST circuit in the aforementioned embodiment of the present invention, the circuit-under-test is a memory and the unit circuit and the selection and activation circuit are multiplexers or OR gates, for example. In addition, the non-timing-critical path is a signal path having the shortest delay time.

The present invention also provides a method of performing a built-in self-testing (BIST) for self-testing a circuit-under-test in a system. The system further comprises a unit circuit having a plurality of input terminals. The input terminals of the unit circuit are coupled to a plurality of signal paths, respectively. The output terminal of the unit circuit is coupled to the circuit-under-test for providing the signals necessary for accessing the circuit-under-test. The BIST method includes the following steps. First, a non-timing-critical path is selected from among various signal paths. When the system is in a test mode, the test signals are provided to test the circuit-under-test. In the test mode, the selected non-timing-critical path is switched to the test signals so that the test signals pass through the unit circuit to test the circuit-under-test.

According to the BIST method of the aforementioned embodiment of the present invention, the step of selecting the non-timing-critical path among the signal paths includes selecting the signal path having the shortest delay time.

The present invention also provides a computer readable recording medium for storing a computer system executable program. The program includes the following instructions. First, read a system including a circuit-under-test and a unit circuit. Wherein, a plurality of input terminals of the unit circuit is coupled to a plurality of signal paths respectively and an output terminal of the unit circuit is coupled to the circuit-under-test to provide all the necessary test signals. According to the characteristics of the circuit-under-test, a built-in self-test (BIST) circuit is established in the system to self test a circuit-under-test. The BIST circuit comprises a BIST controller for providing the test signals to test the circuit-under-test when the system operates in a test mode. Then, a non-timing-critical path is selected from among the signal paths and a selection and activation circuit is established in the system. One of the input terminals of the selection and activation circuit receives the test signals. Another input terminal of the selection and activation circuit is coupled to the selected non-timing-critical path. The output terminal of the selection and activation circuit is coupled to a corresponding input terminal of the unit circuit for outputting the test signals to the output terminals of the selection and activation circuit when the system operates in the test mode. The test signals pass through the unit circuit to test the circuit-under-test.

In the present invention, because the selection and activation circuit for switching the test signals is deployed on the non-timing-critical path, the addition of a built-in self-test circuit will not slow down the clocking speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
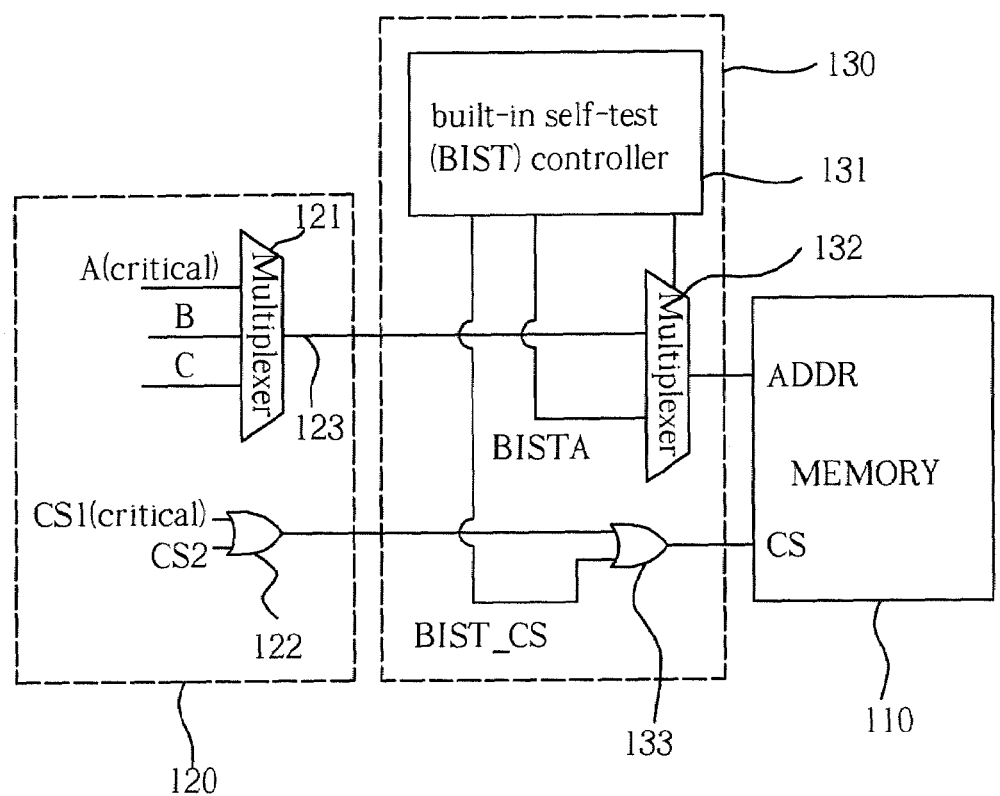
FIG. 1 is a block diagram showing a conventional integrated circuit having a built-in self-test circuit therein.

Reference will now be made in detail to the present preferred embodiments of the invention, examples of which are illustrated in the accompanying drawings. Wherever possible, the same reference numbers are used in the drawings and the description to refer to the same or like parts.

Figure 2:
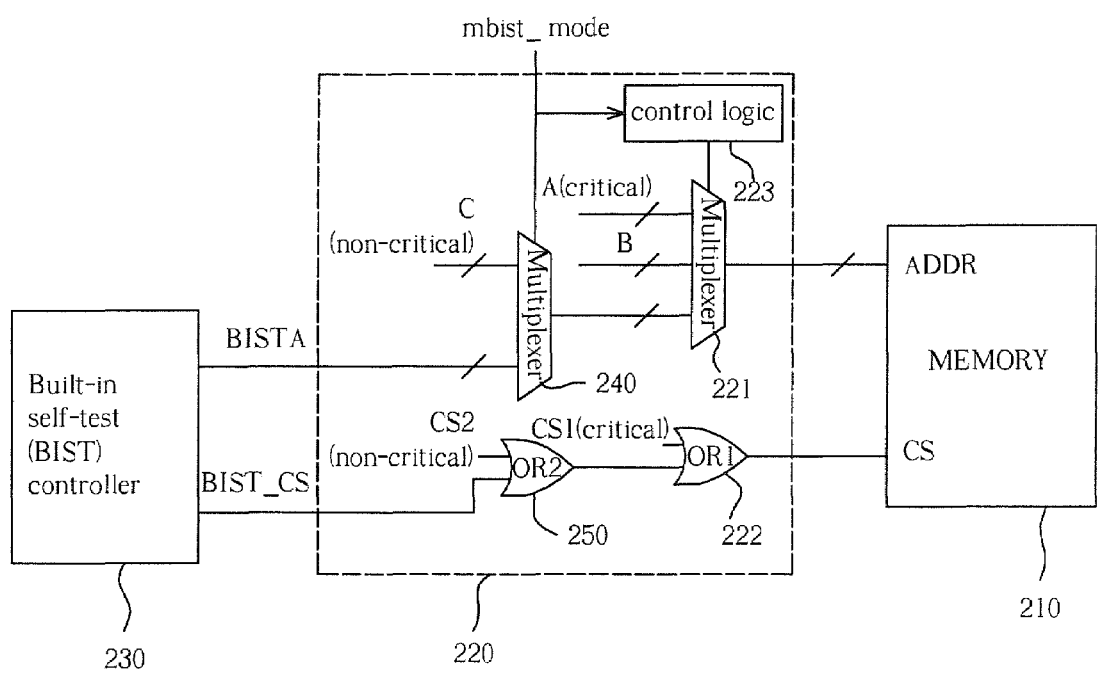
FIG. 2 is a block diagram of a system having a built-in self test (BIST) circuit according to one preferred embodiment of the present invention.

FIG. 2 is a block diagram of a system having a built-in self test (BIST) circuit according to one preferred embodiment of the present invention. To simplify the explanation, the memory 210 in FIG. 2 represents the circuit-under-test and the address signal ADDR and the chip-select line CS together represent the plurality of input terminals of the memory 210. In addition, the unit circuit (for example, comprising a multiplexer 221 and an OR gate 222) connected to the memory 210 represents the logic circuit 220 in the system.

The built-in self-test (BIST) circuit includes a BIST controller 230 and a selection and activation circuit (for example, comprising a multiplexer 240 and an OR gate 250). Through the BIST circuit, the system can perform a self-test of a circuit-under-test (the memory 210) within the system. A plurality of input terminals of the unit circuit (that is, the OR gate 222 or the multiplexer 221) is coupled to a plurality of signal paths, respectively. For example, the input terminals of the multiplexer 221 are coupled to the signal paths A, B and C respectively. Here, assume the signal path A is a timing-critical path. The output terminals of the unit circuit are coupled to the circuit-under-test to provide the signals to the circuit-under-test.

The coupling method for the OR gate 250 and the multiplexer 240 representing the selection and activation circuit is as follows. First, the path having the shortest delay time is selected as a non-timing-critical path from the signal paths A, B and C, for example. Next, the multiplexer 240 (the selection and activation circuit) is added to the selected signal path (for example, the signal path C) so that the output terminal of the multiplexer 240 is coupled to the input terminal of the multiplexer 221 which was originally coupled to the signal path C. One of the input terminals of the multiplexer 240 is coupled to the signal path C. Another input terminal of the multiplexer 240 is coupled to the BIST controller 230. Similarly, the OR gate 250 is added to the signal path CS2 (assuming that the signal path CS1 is the timing-critical path). Therefore, the output terminal of the OR gate 250 is coupled to the OR gate 222. One of the input terminals of the OR gate 250 is coupled to the signal path CS2 while another input terminal of the OR gate 250 is coupled to the BIST controller 230. Consequently, the addition of the BIST circuit in the present invention will not slow down the clocking speed.

When the system operates in a normal mode, the control signal mbist_mode controls the multiplexer 240 so that the signal path C is transmitted to the multiplexer 221. Hence, the logic circuit 220 can access the memory 210. When the system operates in the test mode, the control signal mbist_mode controls the multiplexer 240 so that the test signal BISTA from the BIST controller 230 is transmitted to the output terminal of the multiplexer 240. In the meantime, the control signal mbist_mode also controls the multiplexer 221 via the control logic 223 such that the test signal BISTA is transmitted to the address input terminal ADDR of the memory 210. Thus, the test signal passes through the selection and activation circuit and the unit circuit to test the circuit-under-test. The test signal line (the chip-select line) BIST_CS from the BIST controller 230 that passes through the OR gates 250 and 222 is transmitted to the chip select input terminal CS of the memory 210.

The present invention also provides a built-in self-test (BIST) method for testing a circuit-under-test (for example, a memory) in a system. The system includes a unit circuit (for example, a multiplexer or an OR gate) having a plurality of input terminals coupled to a plurality of signal paths, respectively. And the output terminals are coupled to the circuit-under-test for providing signals to the circuit-under-test. The BIST method includes the following steps. First, a non-timing-critical path is selected from the signal paths. When the system operates in a test mode, the selected non-timing-critical path is switched to the test signals so that the test signals pass through the unit circuit to test the circuit-under-test. The step of choosing a non-timing-critical path includes selecting a signal path having the shortest delay time.

In the following, a preferred embodiment is described to explain a program stored inside a computer readable recording medium that can be executed by a computer system. The program includes the following instructions:

First, a system having a circuit-under-test (for example, a memory) and a unit circuit (for example, a multiplexer or an OR gate) is read into a computer system. The input terminals of the unit circuit are connected to various signal paths and the output terminals of the unit circuit are connected to the circuit-under-test to provide the circuit-under-test with necessary signals. The system is defined using a hardware description language (HDL), for example.

Next, according to the characteristics of the circuit-under-test, a built-in self-test (BIST) circuit is established in the system. The BIST circuit are provides for a system to self test the circuit-under-test in the system. Furthermore, the BIST circuit comprises a BIST controller for generating the test signals to test the circuit-under-test when the system operates in the test mode.

A non-timing critical path is selected from the signal paths. The selected non-timing-critical path is a signal path having the shortest delay time, for example.

Next, a selection and activation circuit is established in the system. One of the input terminals of the selection and activation circuit receives the test signal and another input terminal of the selection and activation circuit is coupled to the selected non-timing-critical path. The output terminal of the selection and activation circuit is coupled to one input terminal of the unit circuit so that test signals can pass through the selection and activation circuit and the unit circuit to test the circuit-under-test when the system operates in a test mode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in self-test (BIST) circuit for serving to self test a circuit-under-test in a system, wherein the system further comprises a unit circuit having a plurality of input terminals such that the input terminals are coupled to a plurality of signal paths respectively and an output terminal is coupled to the circuit-under-test for providing the circuit-under-test with necessary signals, the BIST circuit comprising:
  a BIST controller for generating a test signal to test the circuit-under-test when the system operates in a test mode; and
  a selection and activation circuit, wherein an output terminal of the selection and activation circuit is coupled to one of the input terminals of the unit circuit, one of the input terminals of the selection and activation circuit is coupled to a corresponding non-timing-critical path of the signal paths, and another input terminal of the selection and activation circuit receives the test signal so that the test signal can be output to the output terminal of the selection and activation circuit for transmitted through the unit circuit to test the circuit-under-test when the system operates in a test mode.

2. The BIST circuit of claim 1, wherein the circuit-under-test is a memory.

3. The BIST circuit of claim 1, wherein the unit circuit is a multiplexer.

4. The BIST circuit of claim 1, wherein the unit circuit is an OR gate.

5. The BIST circuit of claim 1, wherein the selection and activation circuit is a multiplexer.

6. The BIST circuit of claim 1, wherein the selection and activation circuit is an OR gate.

7. The BIST circuit of claim 1, wherein the non-timing-critical path is a signal path having the shortest delay time.

8. A built-in self-testing (BIST) method for self-testing a circuit-under-test in a system, wherein the system further comprises a unit circuit having a plurality of input terminals such that the input terminals are coupled to a plurality of signal paths respectively and an output terminal is coupled to the circuit-under-test for providing the circuit-under-test with necessary signals, the BIST method comprising:
  selecting a non-timing-critical path from the signal paths;
  providing a test signal to test the circuit-under-test when the system operates in a test mode; and
  switching the selected non-timing-critical path to the test signal so that the test signal can pass through the unit circuit to test the circuit-under-test when the system is in the test mode.

9. The BIST method of claim 8, wherein the step of selecting the non-timing-critical path from the signal paths further comprises choosing a signal path having the shortest delay time.

10. The BIST method of claim 8, wherein the circuit-under-test is a memory.

11. The BIST method of claim 8, wherein the unit circuit is a multiplexer.

12. A computer readable recording medium for storing an executable program inside a computer system, the program comprising:
  a function of reading a system including:
    a circuit-under-test; and
    a unit circuit having a plurality of input terminals, wherein the input terminals of the unit circuit are coupled to a plurality of signal paths respectively and an output terminal of the unit circuit is coupled to the circuit-under-test for proving the circuit-under-test with necessary signals;
  a function of establishing a built-in self-test (BIST) circuit in the system according the characteristics of the circuit-under-test so that the BIST circuit can provide a self test on the circuit-under-test in the system, wherein the BIST circuit comprises a BIST controller for providing a test signal to test the circuit-under-test when the system operates in a test mode;
  a function of selecting a non-timing-critical path from the signal paths; and
  a function of establishing a selection and activation circuit having a plurality of input terminals in the system, wherein one of the input terminals of the selection and activation circuit receives the test signal, another input terminal of the selection and activation circuit is coupled to the selected non-timing-critical path and an output terminal of the selection and activation circuit is coupled to a corresponding input terminal of the unit circuit for outputting the test signal to the output terminal of the selection and activation circuit and then passing the test signal through the unit circuit to test the circuit-under-test when the system operates in the test mode.

13. The computer readable recording medium of claim 12, wherein the circuit-under-test is a memory.

14. The computer readable recording medium of claim 12, wherein the unit circuit is a multiplexer.

15. The computer readable recording medium of claim 12, wherein the unit circuit is an OR gate.

16. The computer readable recording medium of claim 12, wherein the selection and activation circuit is a multiplexer.

17. The computer readable recording medium of claim 12, wherein the selection and activation circuit is an OR gate.

18. The computer readable recording medium of claim 12, wherein the selected non-timing-critical path is a signal path having the shortest delay time.

* * * * *